US 9,000,527 B2

(12) United States Patent
Noorlag

(10) Patent No.: US 9,000,527 B2
(45) Date of Patent: Apr. 7, 2015

(54) GATE STACK WITH ELECTRICAL SHUNT IN END PORTION OF GATE STACK

(75) Inventor: Date Jan Willem Noorlag, Seongnam-si (KR)

(73) Assignee: Apple Inc., Cupertino, CA (US)

( * ) Notice: Subject to any disclaimer, the term of this patent is extended or adjusted under 35 U.S.C. 154(b) by 29 days.

(21) Appl. No.: 13/613,531

(22) Filed: Sep. 13, 2012

(65) Prior Publication Data

US 2013/0307081 A1 Nov. 21, 2013

Related U.S. Application Data

(60) Provisional application No. 61/647,218, filed on May 15, 2012.

(51) Int. Cl.
| H01L 21/70 | (2006.01) |
| H01L 21/8238 | (2006.01) |
| H01L 27/02 | (2006.01) |

(52) U.S. Cl.
CPC .... *H01L 21/823842* (2013.01); *H01L 27/0207* (2013.01)

(58) Field of Classification Search
CPC .......... H01L 29/78648; H01L 29/78645; H01L 21/823842
USPC .............................. 257/368, 369
See application file for complete search history.

(56) References Cited

U.S. PATENT DOCUMENTS

| 4,894,702 A | 1/1990 | Maas et al. |
| 5,990,520 A | 11/1999 | Noorlag et al. |
| 7,176,519 B2 | 2/2007 | Schuler |
| 7,675,097 B2 | 3/2010 | Adkisson et al. |
| 8,218,380 B2 | 7/2012 | Noorlag |
| 8,248,095 B2 | 8/2012 | Noorlag et al. |
| 8,299,825 B2 | 10/2012 | Noorlag et al. |
| 2007/0018247 A1* | 1/2007 | Brindle et al. ................. 257/347 |
| 2008/0157212 A1* | 7/2008 | Lavoie et al. ................. 257/369 |
| 2009/0020791 A1* | 1/2009 | Yu et al. ........................ 257/288 |
| 2009/0140345 A1* | 6/2009 | Zhu ............................... 257/369 |
| 2010/0006926 A1 | 1/2010 | Zhu et al. |
| 2010/0052067 A1* | 3/2010 | Hsu et al. ....................... 257/369 |
| 2010/0187610 A1* | 7/2010 | Kwon et al. ................... 257/369 |
| 2011/0095357 A1 | 4/2011 | Hu |
| 2011/0101462 A1* | 5/2011 | Torii .............................. 257/368 |
| 2011/0101990 A1 | 5/2011 | Noorlag et al. |
| 2011/0102064 A1 | 5/2011 | Noorlag et al. |
| 2011/0210403 A1 | 9/2011 | Teo et al. |

(Continued)

OTHER PUBLICATIONS

WIPO, International Preliminary Report on Patentability, International Application No. PCT/US/038166 (report issued Nov. 18, 2014).*

(Continued)

*Primary Examiner* — Fernando L Toledo
*Assistant Examiner* — Victoria K Hall
(74) *Attorney, Agent, or Firm* — Meyertons, Hood, Kivlin, Kowert & Goetzel, P.C.; Gareth M. Sampson

(57) ABSTRACT

A semiconductor device is formed in which a first-type doped field effect transistor has a first gate stack that has an end portion with a second gate stack formed for a second-type, complementary doped field effect transistor. Lateral electrical contact is made between the first gate stack and the second gate stack. The lateral electrical contact provides an electrical shunt at the end of the first gate stack.

25 Claims, 5 Drawing Sheets

(56) References Cited

U.S. PATENT DOCUMENTS

| | | |
|---|---|---|
| 2011/0223727 A1 | 9/2011 | Ko et al. |
| 2011/0228603 A1 | 9/2011 | Takashima |
| 2012/0012937 A1* | 1/2012 | Chew et al. ............... 257/369 |
| 2012/0056250 A1 | 3/2012 | Snyder et al. |
| 2013/0256805 A1* | 10/2013 | Chuang et al. ............ 257/369 |
| 2014/0110792 A1* | 4/2014 | Noorlag ..................... 257/369 |

OTHER PUBLICATIONS

U.S. Appl. No. 13/658,049, filed Oct. 23, 2012, inventor Noorlag.
International Search Report and Written Opinion in Application No. PCT/US2013/038166, mailed Jun. 28, 2013, pp. 1-9.

* cited by examiner

US 9,000,527 B2

GATE STACK WITH ELECTRICAL SHUNT IN END PORTION OF GATE STACK

PRIORITY CLAIM

This patent claims priority to U.S. Provisional patent application No. 61/647,218 to Noorlag, entitled "GATE STACK WITH ELECTRICAL SHUNT IN END PORTION OF GATE STACK", filed May 15, 2012, which is incorporated by reference in its entirety.

BACKGROUND

1. Field of the Invention

The present invention relates to semiconductor devices and methods for forming semiconductor devices. More particularly, the invention relates to forming high dielectric gate insulation above field effect transistors.

2. Description of Related Art

High-k (dielectric constant) dielectric materials have been used to replace silicon oxide/nitride as the gate dielectric in MOSFET (metal-oxide-semiconductor field-effect transistor) devices as the size of MOSFET devices continually becomes smaller and smaller. The high dielectric constant of the high-k dielectric material allows increased gate capacitance while inhibiting leakage due to tunneling. New issues and/or problems arise as the designs of structures using high-k dielectric materials, the processes for forming such structures (e.g., gate first high-k metal gate (HKMG) processes), and the uses of such structures continue to change. Thus, there is continuing development of new solutions to overcome some of these issues and/or problems.

Certain problems may be seen with the use of high-k dielectric materials in gate stack structures in gate first HKMG processes. For example, because the gate stack uses several materials in combination with the high-k dielectric material, one potential problem with using high-k dielectric materials in gate stack structures is the possible delamination between two or more of the materials used in the gate stack (e.g., delamination at one or more interfaces between different materials in the gate stack). Delamination at one or more interfaces between materials in the gate stack may cause problems such as high resistance in series with the gate (e.g., high gate series resistance). The high gate series resistance (e.g., on the order of MΩ, 10 MΩ, or more in resistance) in the transistor may not cause failure of the transistor but may slow down the transistor to unacceptable or undesirable levels.

SUMMARY

In certain embodiments, a semiconductor device includes a field effect transistor (FET) of a first dopant type (e.g., a p-type doped transistor or a PFET transistor (a PMOS FET)). The field effect transistor may include a first gate stack with a second gate stack formed in the end portion of the first gate stack. The second gate stack may include gate stack layers designed for a field effect transistor of a second dopant type (e.g., an n-type doped transistor or an NFET transistor (an NMOS FET). Lateral electrical contact may be made between the first gate stack and the second gate stack in the end portion of the first gate stack. In some embodiments, the lateral electrical contact reduces any gate series resistance produced by delamination in the first gate stack by acting as an electrical shunt at the end of the first gate stack.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1:
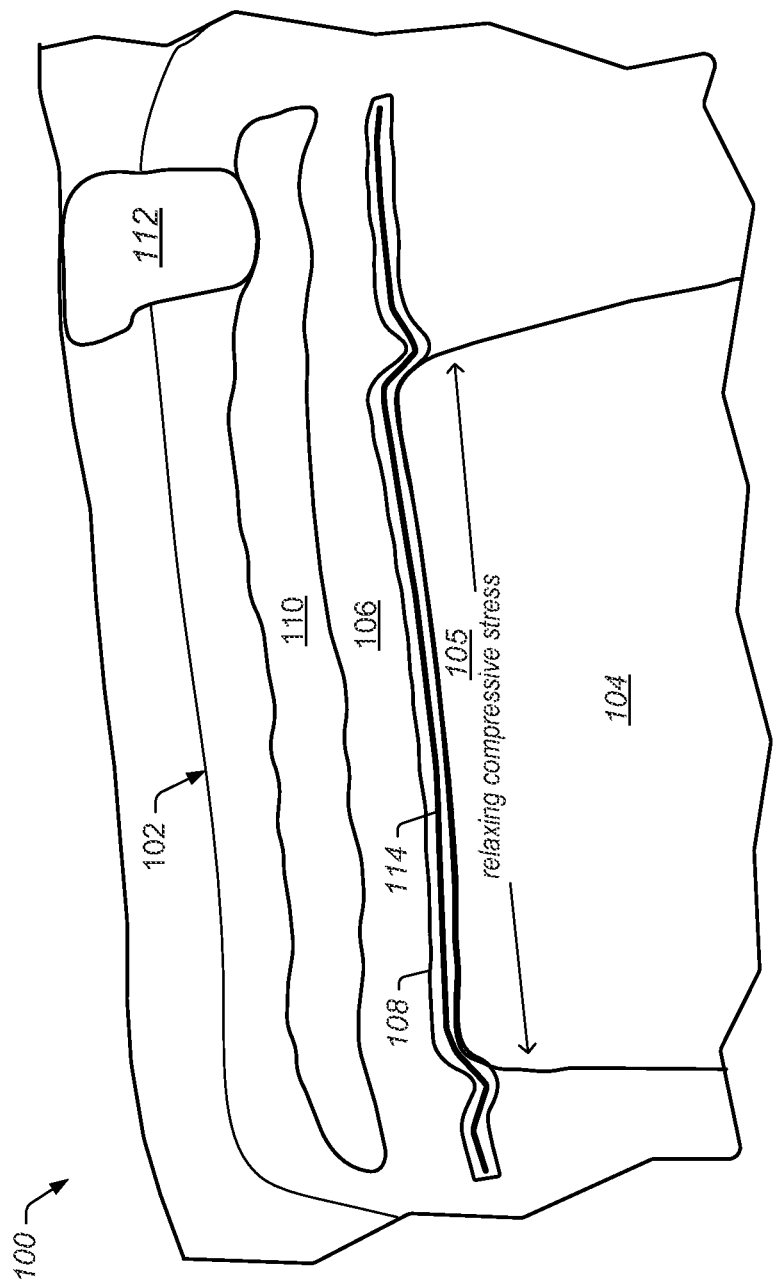
FIG. 1 depicts a cross-sectional representation of an example of a PMOS field effect transistor (PFET), formed using a gate first HKMG process, that may have delamination in the gate stack.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

FIG. 1 depicts a cross-sectional representation of an example of a PMOS field effect transistor (PFET), formed using a gate first HKMG process, that may have delamination in the gate stack. PFET transistor 100 includes gate 102 formed above n-well region 104. N-well region 104 may be, for example, a well region doped with n-type dopant. In certain embodiments, channel region 105 is formed at the surface of the n-well region. Channel region 105 may be, for example, a SiGe channel region. Gate 102 includes poly layer 106 above gate stack 108. In certain embodiments, metal silicide 110 (e.g., NiSi) and gate contact 112 are formed above poly layer 106.

Figure 2:
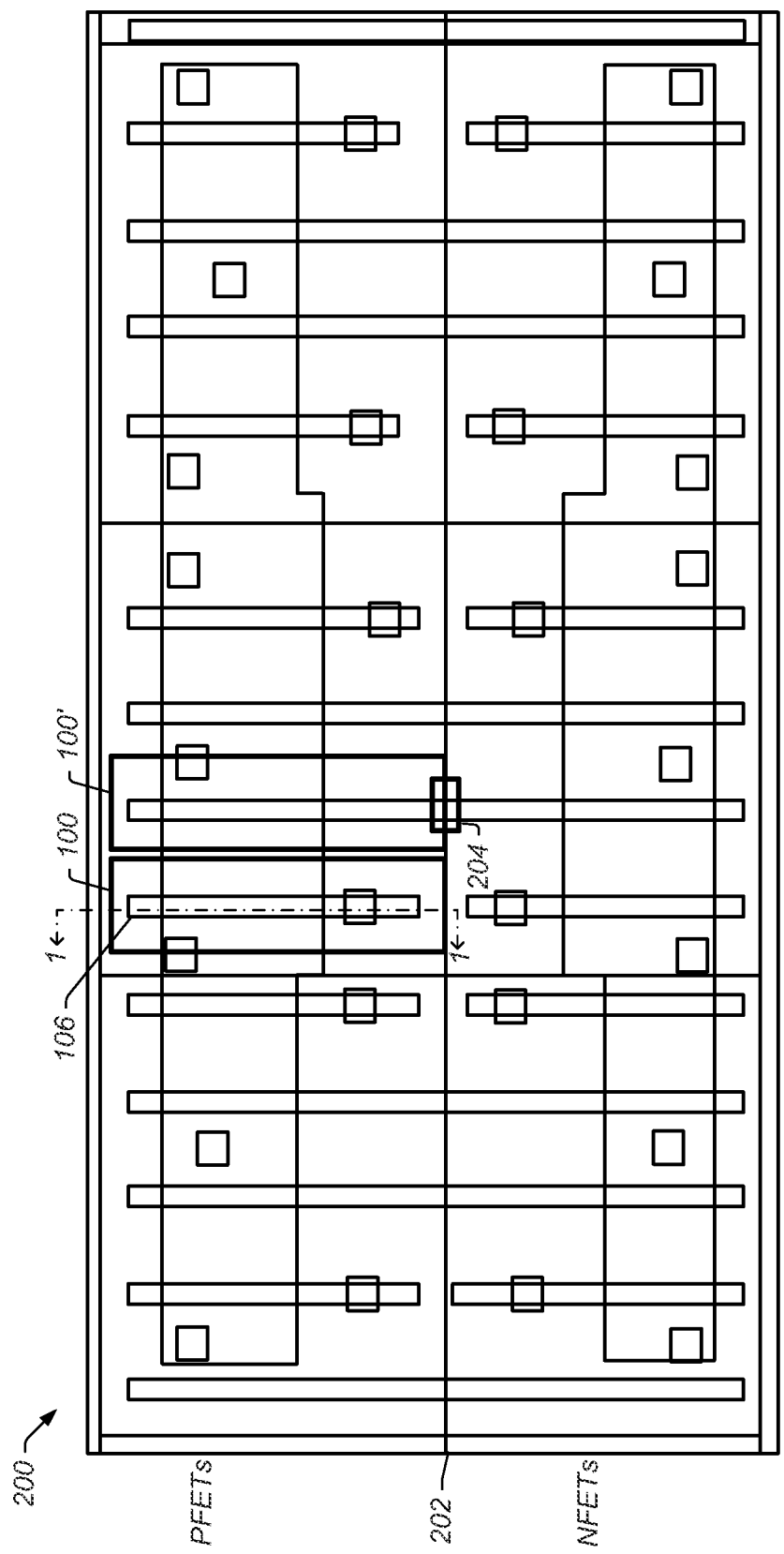
FIG. 2 depicts a top-view representation of an embodiment of a semiconductor device with a row of PFET transistors (top row) and a row of NFET transistors (bottom row).

In certain embodiments, PFET transistor 100 is one of several PFET transistors on a semiconductor device. The semiconductor device may include one or more NFET transistors in addition to the one or more PFET transistors. In some embodiments, the PFET transistors and the NFET transistors are neighboring or adjacent in the semiconductor device. FIG. 2 depicts a top-view representation of an embodiment of semiconductor device 200 with a row of PFET transistors (top row) and a row of NFET transistors (bottom row). PFET 100, depicted in cross-section in FIG. 1, is located in the top row of PFET transistors in FIG. 2.

In certain embodiments, as shown in FIG. 1, gate stack 108 is formed above channel region 105 in a PFET first process. In the PFET first process, $HfO_2$ (or other suitable high-k dielectric material) is deposited over the semiconductor device followed by deposition of the TiN-Al-TiN stack layers (or other suitable metal gate layers). Following deposition of the TiN-Al-TiN stack layers, a mask pattern is used to remove the TiN-Al-TiN layers in defined areas above NFET transistors. For example, mask line 202, shown in FIG. 2, may define the areas above the NFETs for removal of the TiN-Al-TiN layers (e.g., the mask line defines the areas for NFET gate stack deposition). After removal of the TiN-Al-TiN in the defined areas, La and TiN (or other suitable metal gate layers) are deposited over the semiconductor device to form the $HfO_2$-La-TiN gate stack structures for gate stacks in the NFET transistors. Because the TiN-Al-TiN layers are already present in gate stack 108 in PFET transistor 100, shown in FIG. 1, the La and TiN layers are deposited on top of the TiN-Al-TiN layers in gate stack 108 and gate stack 108 has the $HfO_2$-TiN-Al-TiN-La-TiN gate stack structure. Though the La-TiN top layers have no function in PFET transistor 100, the presence of the La-TiN top layers may lead to delamination in gate stack 108 due to stresses in the PFET transistor with the delamination potentially causing high gate series resistance in the PFET transistor and slower PFET transistor operation in response to gate voltage changes. Having one or more transistors with slower response on a semiconductor device may produce a cost and yield penalty on the semiconductor device.

After formation of the gate stacks for both the PFET transistors and the NFET transistors, a polysilicon layer (or other suitable conductive gate layer) may be deposited over semiconductor device 200, shown in FIG. 2, and the polysilicon layer is patterned to form poly layer 106 in PFET transistor 100 (shown in FIGS. 1 and 2) and poly layers in additional PFET transistors and NFET transistors on the semiconductor device.

In some embodiments, poly layers and their underlying gate stacks extend across the semiconductor device between the row of PFET transistors and the row of NFET transistors without a break in the poly layers or the gate stacks. For example, PFET transistor 100', shown in FIG. 2, has a poly layer (and underlying gate stack structure) that extends into the row of NFET transistors (e.g., the PFET transistor has a long poly layer). Cut 204 is formed between the PFET region and the NFET region along the long poly layer to define the transition between the PFET transistor and the NFET transistor during formation of the gate stacks. In certain embodiments, cut 204 is formed by mask line 202 in the mask pattern used for defining areas for removal of the TiN-Al-TiN layers before forming the NFET transistor gate stacks.

As shown in FIG. 2, no cut is present between PFET transistor 100 (e.g., a short poly transistor) and its laterally adjacent NFET transistor as there is a gap between PFET transistor 100 and its laterally adjacent NFET transistor and mask line 202 does not intersect the poly layer pattern for PFET transistor 100. Thus, mask line 202 does not cut the underlying gate stack pattern and PFET transistor 100 has gate stack 108, as shown in FIG. 1, that terminates with the $HfO_2$-TiN-Al-TiN-La-TiN gate stack structure.

As shown in FIG. 1, because of stresses in PFET transistor 100 (e.g., relaxing compressive stress in channel region 105 shown by arrows in FIG. 1), there may be delamination 114 in gate stack 108. Compressive stress in channel region 105 may be due to the presence of c-SiGe in the channel region used for control of the threshold voltage. Delamination 114 may occur, for example, at the interface between the TiN-Al-TiN stack layers and the La-TiN stack layers (e.g., at the TiN-La-TiN interface). Delamination 114 may cause high gate series resistance (e.g., on the order of MΩ, 10 MΩ or more in resistance) in PFET transistor 100. The high gate series resistance in PFET transistor 100 may not cause failure of the transistor but may slow down the transistor to unacceptable or undesirable speeds. Slow down of one or more PFET transistors on semiconductor device 200 may produce yield issues with the semiconductor device.

Figure 3:
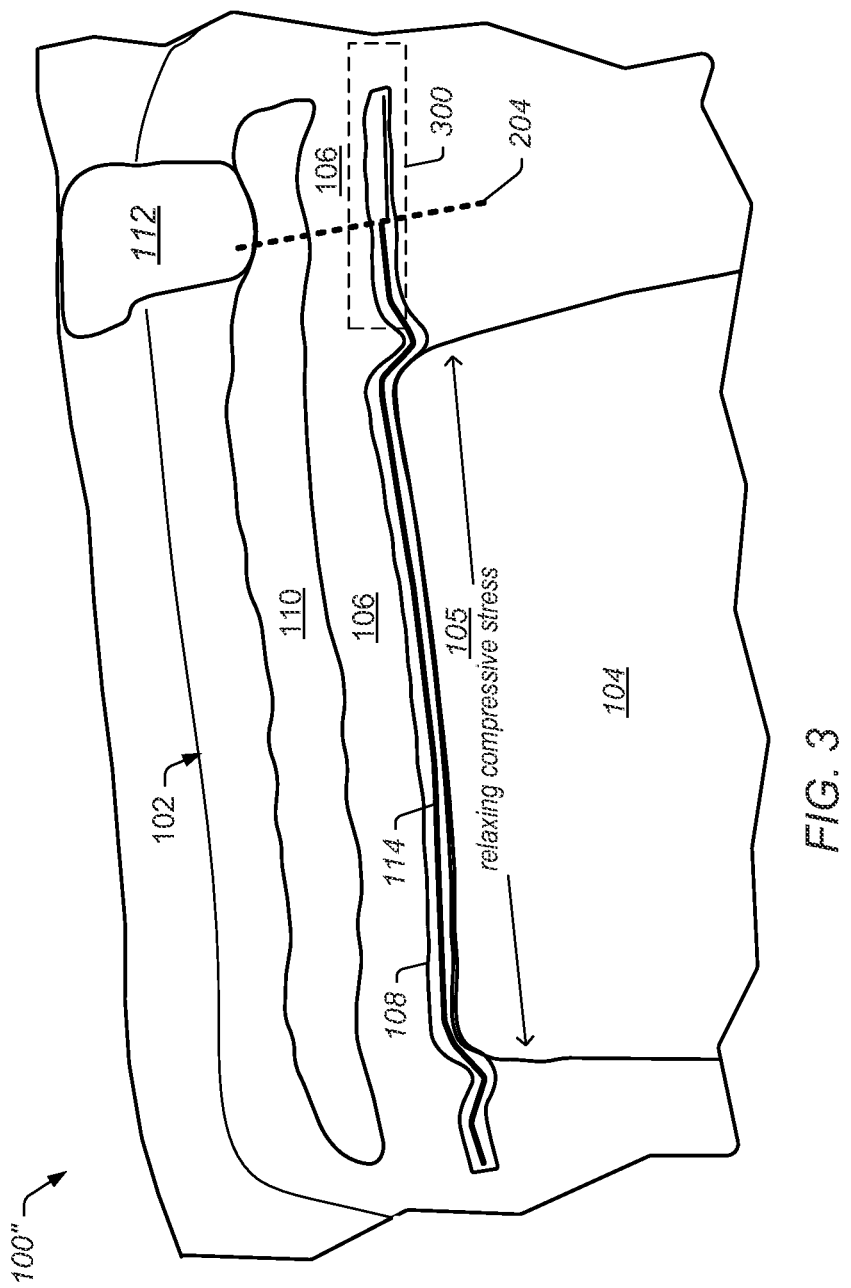
FIG. 3 depicts a cross-sectional representation of an embodiment of a PFET transistor with a lateral contact formed between a gate stack in the PFET transistor and an NFET gate stack in an end portion of the PFET transistor.
Figure 4:
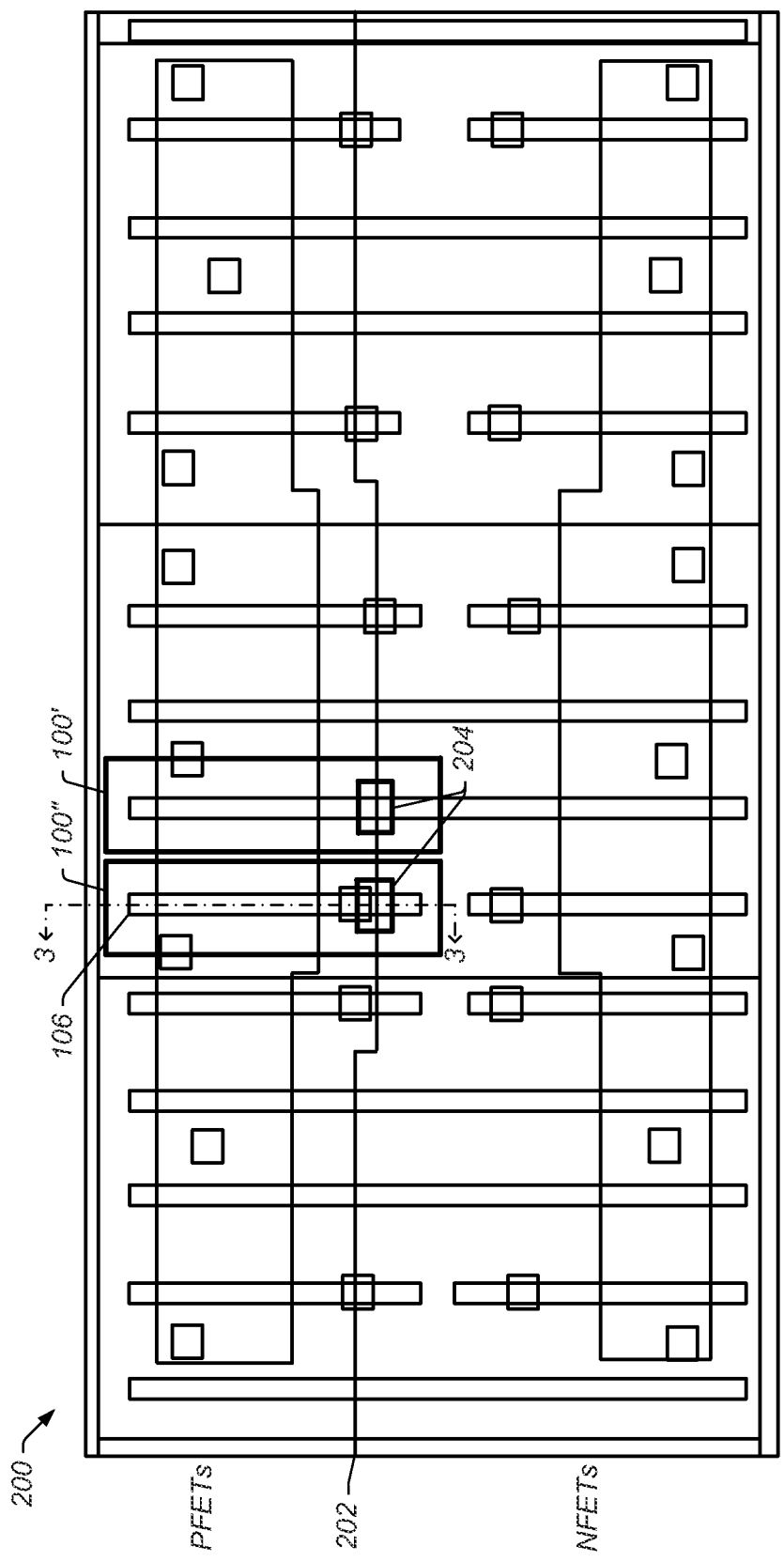
FIG. 4 depicts a top-view representation of another embodiment of a semiconductor device with rows of PFET transistors (top row) and NFET transistors (bottom row).

FIG. 3 depicts a cross-sectional representation of an embodiment of PFET transistor 100" with a lateral contact formed between gate stack 108 in the PFET transistor and an NFET gate stack in an end portion of the PFET transistor. PFET transistor 100" is similar to PFET transistor 100, depicted in FIG. 1. PFET transistor 100" includes gate 102 formed above n-well region 104 (e.g., a well region doped with n-type dopant) and channel region 105 (e.g., a SiGe channel region). Gate 102 includes poly layer 106 above gate stack 108. FIG. 4 depicts a top-view representation of an embodiment of semiconductor device 200 with rows of PFET transistors (top row) and NFET transistors (bottom row) with PFET transistor 100", depicted in cross-section in FIG. 3, located in the top row of PFET transistors. PFET transistor 100" may be, for example, a short poly PFET transistor as described herein.

As described above, gate stack 108 may be formed above channel region 105 in the PFET first process by depositing $HfO_2$ over the semiconductor device, depositing the TiN-Al-TiN stack layers, patterning and removing defined areas of the TiN-Al-TiN layers, and depositing La and TiN layers over the semiconductor device. In certain embodiments, however, as shown in FIGS. 3 and 4, mask line 202, used to define the areas for NFET gate stack deposition, is moved to intersect an end portion of PFET transistor 100" and cut 204 is formed in end portion 300 of gate stack 108 of PFET transistor 100".

Figure 5:
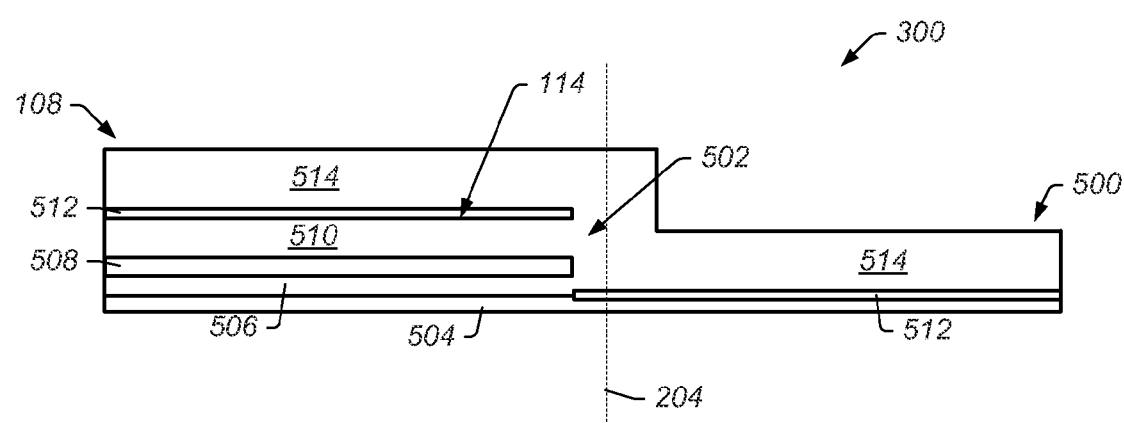
FIG. 5 depicts an enlarged cross-sectional representation of an embodiment of an end portion of a gate stack of the PFET transistor depicted in FIG. 3.

FIG. 5 depicts an enlarged cross-sectional representation of an embodiment of end portion 300 of gate stack 108 of PFET transistor 100". In certain embodiments, gate stack 108 includes $HfO_2$ layer 504, first TiN layer 506, Al layer 508, second TiN layer 510, La layer 512, and third TiN layer 514. Moving cut 204 into end portion 300 of gate stack 108 removes portions of the TiN-Al-TiN stack layers (first TiN layer 506, Al layer 508, and second TiN layer 510) at or near cut 204 and to the right of cut 204, as shown in FIG. 5.

After La layer 512 and TiN layer 514 are deposited over the semiconductor device, NFET gate stack region 500 and lateral electrical contact 502 are formed at or near and to the right of cut 204 where the TiN-Al-TiN stack layers have been removed. NFET gate stack region 500 may be a "dummy" NFET gate stack region formed in end portion 300 of gate stack 108 of PFET transistor 100". Thus, in certain embodiments, NFET gate stack region 500 includes a gate stack structure designed for a transistor that is complementary doped relative to PFET transistor 100" (e.g., NFET gate stack region 500 includes a gate stack structure designed for an NFET transistor, which is a complementary doped transistor to PFET transistor 100"). In certain embodiments, gate stack 108 has an $HfO_2$-TiN-Al-TiN-La-TiN gate stack structure and NFET gate stack region 500 has an $HfO_2$-La-TiN gate stack structure.

Lateral electrical contact 502 includes a transition between NFET gate stack region 500 and gate stack 108 of PFET transistor 100". As shown in FIG. 5, lateral electrical contact 502 includes electrical contact between TiN layer 514 in NFET gate stack region 500 and first TiN layer 506 and/or second TiN layer 510 (e.g., electrical contact between the TiN layer in the NFET gate stack region and the active TiN layers in the PFET gate stack). The electrical contact between the TiN layers provides an electrical shunt (or patch) between layers of gate stack 108 of PFET transistor 100".

If delamination or other electrical problems occur in gate stack 108, lateral electrical contact 502 shunts these electrical problems. For example, the shunt provided by lateral electrical contact 502 may reduce the gate series resistance to acceptable levels if delamination occurs to inhibit problems (e.g., slow transistor operation) with high gate series resistance. Thus, the use of lateral electrical contact 502 and NFET gate stack region 500 in end portion 300 of gate stack 108 may provide a solution to potential electrical problems in PFET transistor 100" that is easily integratable into current and/or future process flows used to form PFET transistors, NFET transistors, and/or similar MOS technologies. Additionally, use of lateral electrical contact 502 and NFET gate stack region 500 in end portion 300 of gate stack 108 may produce better yields on a semiconductor device and/or in multiple semiconductor device process flow.

Embodiments described herein describe a method for forming a lateral electrical contact in a PFET first process with high-k dielectric materials. It would be apparent to those skilled in the art, however, that the embodiments described herein may be applied to forming a substantially similar lateral electrical contact in an NFET first process.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming a semiconductor device, comprising:
    forming a first gate stack above a channel region of a field effect transistor;
    forming a second gate stack in an end portion of the field effect transistor, wherein at least a portion of the second gate stack is electrically coupled to at least a portion of the first gate stack, and wherein the second gate stack forms a terminal end of a gate formed in the field effect transistor; and
    forming a polysilicon layer over the field effect transistor, wherein he polysilicon layer is not shared with a laterally adjacent complementary doped field effect transistor;
    wherein the second gate stack is configured for the laterally adjacent complementary doped field effect transistor to the field effect transistor.

2. The method of claim 1, wherein the electrically coupled portions of the first gate stack and the second gate stack comprise substantially similar materials.

3. The method of claim 1, wherein the second gate stack is formed in a terminal end portion of the first gate stack, and wherein the second gate stack forms an electrical shunt between two or more layers of the first gate stack.

4. The method of claim 1, wherein the second gate stack is formed outside the channel region of the field effect transistor.

5. The method of claim 1, wherein the second gate stack is formed with at least a portion of the second gate stack being above the first gate stack.

6. The method of claim 1, wherein the first gate stack comprises an $HfO_2$-TiN-Al-TiN-La-TiN gate stack structure and the second gate stack comprises an $HfO_2$-La-TiN gate stack structure.

7. A method for forming a semiconductor device, comprising:
    forming a first gate stack over a portion of the semiconductor device;
    removing a portion of the first gate stack above at least a terminal end portion of at least one field effect transistor, wherein the terminal end portion of the at least one field effect transistor comprises a terminal end portion defined for a gate in the at least one field effect transistor;
    forming a second gate stack over the portion of the semiconductor device, wherein at least a portion of the second gate stack is electrically coupled to at least a portion of the first gate stack in the terminal end portion of the at least one field effect transistor;
    wherein the second gate stack is designed for a laterally adjacent complementary doped field effect transistor to the at least one field effect transistor; and
    forming a polysilicon layer over the at least one field effect transistor and the laterally adjacent complementary doped field effect transistor, wherein there is a gap between a portion of the polysilicon layer formed over the at least one field effect transistor and a portion of the polysilicon layer formed over the laterally adjacent complementary doped field effect transistor.

8. The method of claim 7, wherein forming the first gate stack comprises forming one or more gate stack layers over the portion of the semiconductor device.

9. The method of claim 7, wherein forming the second gate stack comprises forming one or more gate stack layers over the portion of the semiconductor device.

10. The method of claim 7, wherein forming the first gate stack comprises forming $HfO_2$-TiN-Al-TiN layers over the portion of the semiconductor device.

11. The method of claim 7, wherein forming the second gate stack comprises forming La and TiN layers over the portion of the semiconductor device.

12. A semiconductor device, comprising:
    a first gate stack above a channel region of a field effect transistor; and
    a second gate stack in an end portion of the field effect transistor, wherein at least a portion of the second gate stack is electrically coupled to at least a portion of the first gate stack, and wherein the second gate stack defines a terminal end of a gate in the field effect transistor;
    wherein the field effect transistor comprises a polysilicon layer that is not shared with a laterally adjacent complementary field effect transistor: and
    wherein the second gate stack is configured for the laterally adjacent complementary doped field effect transistor to the field effect transistor.

13. The device of claim 12, wherein the second gate stack defines an end of the first gate stack, and wherein the second gate stack comprises an electrical shunt between two or more layers of the first gate stack.

14. The device of claim 12, wherein the second gate stack is located outside the channel region of the field effect transistor.

15. The device of claim 12, wherein the first gate stack comprises an $HfO_2$-TiN-Al-TiN-La-TiN gate stack structure and the second gate stack comprises an $HfO_2$-La-TiN gate stack structure.

16. The device of claim 15, wherein TiN in the first gate stack is electrically coupled to TiN in the second gate stack.

17. The device of claim 12, wherein the gate in the field effect transistor comprises a single gate formed only over the field effect transistor.

18. A semiconductor device, comprising:
- a first gate stack above a channel region of a field effect transistor;
- a second gate stack in an end portion of the field effect transistor, wherein the second gate stack defines a terminal end of a gate stack structure in the field effect transistor; and
- a lateral electrical contact between the first gate stack and the second gate stack that electrically couples at least a portion of the first gate stack to at least a portion of the second gate stack;
- wherein the second gate stack is designed for a laterally adjacent field effect transistor with a different dopant type than the field effect transistor; and
- wherein the field effect transistor comprises a first polysilicon layer and the laterally adjacent field effect transistor doped with the different dopant type comprises a second polysilicon layer, wherein there is a gap between the first polysilicon layer and the second polysilicon layer.

19. The device of claim 18, wherein the lateral electrical contact and the second gate stack comprise substantially similar materials.

20. The device of claim 18, wherein the lateral electrical contact and the second gate stack provides an electrical shunt at an end of the first gate stack.

21. The device of claim 18, wherein the field effect transistor comprises a p-type doped field effect transistor and the second gate stack is configured for an n-type doped field effect transistor.

22. The device of claim 18, wherein the first gate stack comprises an $HfO_2$-TiN-Al-TiN-La-TiN gate stack structure and the second gate stack comprises an $HfO_2$-La-TiN gate stack structure.

23. A system, comprising:
- a semiconductor device comprising a plurality of first gate stacks formed above channel regions of a plurality of first field effect transistors, wherein at least a portion of at least one of the plurality of first gate stacks is formed in a terminal end portion of at least one of the plurality of first field effect transistors, and wherein the terminal end portion defines a terminal end of a gate of the at least one of the plurality of first field effect transistors;
- wherein at least one second gate stack is formed in the terminal end of the gate of the at least one of the plurality of first field effect transistors, and wherein at least a portion of the at least one second gate stack is electrically coupled to at least the portion of the at least one first gate stack in the end portion;
- wherein the second gate stack is formed for a plurality of second field effect transistors on the semiconductor device, wherein the plurality of second field effect transistors comprise complementary doping to the plurality of first field effect transistors; and
- wherein the at least one of the plurality of first field effect transistors and its laterally adjacent complementary field effect transistor of the plurality of second field effect transistors comprise polysilicon layers with a gap between the polysilicon layers.

24. The device of claim 23, wherein the first gate stacks comprise an $HfO_2$-TiN-Al-TiN-La-TiN gate stack structure and the at least one second gate stack comprises an $HfO_2$-La-TiN gate stack structure.

25. The device of claim 23, wherein the first field effect transistors are formed before the second field effect transistors.

* * * * *